United States Patent [19]

Onoe et al.

[11] Patent Number: 5,722,184

[45] Date of Patent: Mar. 3, 1998

[54] METHOD FOR FEEDING METALORGANIC GAS FROM SOLID RAW MATERIALS IN MOCVD AND ITS DEVICE

[75] Inventors: Atsushi Onoe; Kiyofumi Chikuma; Hirofumi Kubota, all of Tsurugashima, Japan

[73] Assignee: Pioneer Electronic Corporation, Tokyo, Japan

[21] Appl. No.: 624,894

[22] Filed: Mar. 27, 1996

[30] Foreign Application Priority Data

Mar. 30, 1995 [JP] Japan ............................... 7-097942

[51] Int. Cl.$^6$ ............................................... F26B 17/00
[52] U.S. Cl. ............................................... 34/586; 34/408
[58] Field of Search ............................... 34/359, 364, 363, 34/576, 582, 586, 443, 408

[56] References Cited

U.S. PATENT DOCUMENTS 3,089,250  5/1963  Victor ........................... 34/443
4,734,999  4/1988  Fujisawa et al. ............. 34/57
4,916,828  4/1990  Yamane et al. ............... 34/10
5,019,423  5/1991  Hiai et al. ..................... 427/248.1
5,377,429  1/1995  Sandhu et al. ............... 34/586
5,480,677  1/1996  Li et al. ........................ 427/248.1
5,553,395  9/1996  Wen et al. .................... 34/359

*Primary Examiner*—Henry A. Bennett
*Assistant Examiner*—Dinnatia Doster
*Attorney, Agent, or Firm*—Morgan, Lewis & Bockius LLP

[57] ABSTRACT

A method for feeding metalorganic gas from solid raw materials in MOCVD and its device provides an absorption reagent consisting of porous grains into which a solid metalorganic material is absorbed and the passing of the carrier gas among the absorptive porous grains in the container under a high thermal condition. The mixture gas including the metalorganic gas at a constant density is obtained in stability for a long time.

13 Claims, 4 Drawing Sheets

METHOD FOR FEEDING METALORGANIC GAS FROM SOLID RAW MATERIALS IN MOCVD AND ITS DEVICE

BACKGROUND OF THE INVENTION

1. Field of the Invention

The present invention relates to a method for feeding metalorganic gas in an apparatus for forming an oxide thin film for using solid raw materials of organic-metal and its device.

2. Description of the Related Art

There are known methods for forming a thin film made of ferroelectric oxide such as a sputtering method, a liquid phase epitaxy method, a sol-gel method and the like. There is also a metalorganic chemical vapor-phase deposition (MOCVD) in which a high deposition rate and a step-coverage property are obtained and further an epitaxial growth is achieved.

In case that an oxide thin film of nonlinear optical materials is formed in the MOCVD apparatus, dipivaloyl-methane (DPM) complexes are used for solid raw materials since such complexes can be sublimated with a comparatively high vapor pressure at a temperature of 150 to 200 centigrade.

FIG. 1 shows a device for feeding metalorganic gas from solid raw materials to a growth chamber in a conventional MOCVD apparatus in which numeral 1 represents a container for a powdered solid raw material, numeral 2 represents solid raw materials, numeral 3 represents a pair of metal mesh-sieves for supporting solid raw materials therebetween, numeral 4 represents an inlet conduit for a carrier gas, numeral 5 represents a flange, numeral 6 represents an outlet conduit for a mixture of the carrier gas and the sublimated metalorganic gas connected to the growth chamber, and numeral 7 represents an oven for heating the container.

As shown in FIG. 1, the powder of solid raw material 2 for the MOCVD is filled up between the mesh-sieves 3 and disposed in the container 1. Then the container 1 is heated in the oven 7 while the carrier gas is introduced through the inlet conduit 4 into the container. The carrier gas passing through the solid raw material 2 carries the metalorganic gas sublimated from the solid raw material 2 as a mixture gas to go out through the outlet conduit 6, so that this device feeds the mixture gas into the growth chamber of the MOCVD apparatus.

In this way, the bulk of the solid raw material powder supported by the metal mesh-sieves is sublimated while the sublimated metalorganic gas is mixed with the carrier gas directly passing through the bulk material. By this, the mixture gas for the MOCVD is obtained.

FIGS. 2A and 2B show an initial status of the bulk of the solid raw material powder supported by the metal mesh-sieves and a lapsing status of that bulk respectively in the device for feeding metalorganic gas. In FIG. 2A, arrows are representing the carrier gas uniformly passing through the bulk 2 of the solid raw material powder in the beginning of feeding the mixture gas. FIG. 2B illustrates the situation of the bulk of the solid raw material powder after a time-passing of feeding the mixture gas, in which numeral 21 represents holes each penetrating the bulk 2 of the solid raw material powder.

In the conventional device for feeding metalorganic gas, the mixture gas including the metalorganic gas at a predetermined density is obtained in stability during the initial status of the bulk of the solid raw material powder under predetermined conditions, since the carrier gas is uniformly infiltrated into the fresh bulk 2 of the solid raw material powder and passing therethrough in the beginning on the whole. However, after the bulk of the solid raw material powder is repeatedly used to pass the carrier gases through the bulk time after time, the carrier gas forms a plurality of the holes 21 penetrating the bulk 2 to facilitate its passing as shown in FIG. 2. In this case the sublimation of the material tends to mainly occur in internal surfaces of the penetrating holes to consume the bulk of the solid raw material powder. This phenomenon suffers uneven distributions of passages of the carrier gas.

Furthermore, the grain size of the powder of material is generally enlarged due to the re-crystallization caused by the repeated heatings. This phenomenon remarkably promotes such uneven distributions of passages of the carrier gas with the lapse of time.

Therefore, the density of the mixture gas components in the mixture gas is lower than that of the initial state when the initial conditions for the mixture gas is maintained, so that the predetermined density of the metalorganic gas in the mixture gas becomes unstable with the lapse of time. As a result, the required thin film to be formed is lowered in thickness than the expectation, so that the thin film becomes rough or uneven.

SUMMARY OF THE INVENTION

Thus, the present invention has been made to solve such a problem in view of the forgoing status. An object of the invention is to provide a method for feeding metalorganic gas from solid raw materials in the MOCVD and its device capable of feeding the mixture gas to the growth chamber in the MOCVD apparatus while unstably maintaining the density of the metalorganic gas in the mixture gas becomes without respect to the lapse of time.

In an aspect according to the invention, the method for feeding a metalorganic gas from a solid metalorganic material in a MOCVD apparatus comprises the steps of;

absorbing a solid metalorganic material into an absorption reagent consisting of porous grains;

disposing the absorption reagent in a high thermal atmosphere to sublimate the solid metalorganic material; passing a carrier gas through the absorption reagent; thereby stably obtaining a mixture gas comprising the carrier gas and the sublimated metalorganic gas at a saturated vapor pressure.

In another aspect according to the invention, the device for feeding a metalorganic gas from a solid metalorganic material in a MOCVD apparatus comprises;

an absorption reagent consisting of porous grains into which a solid metalorganic material is absorbed;

a container for accommodating and supporting the absorption reagent;

means for heating the container; and means for feeding a carrier gas into container to pass the carrier gas through the absorption reagent.

In an embodiment according to the invention, each of said porous grains has a grain diameter of 1 to 5 mm on an average.

An advantage of the method for feeding metalorganic gas from solid raw materials in the MOCVD and its device according to the present invention is that it provides the smooth passing of the carrier gas among the absorptive porous grains since the solid metalorganic material is previously absorbed into the absorptive porous grains and such grains are set up to the container. Since each absorptive porous grain is constant in its size to maintain the passage for the carrier gas, the mixture gas including the metalorganic gas at a predetermined density is obtained in stability for a long time.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings which are incorporated in and constitute a part of this invention and, together with the description, serve to explain the principles of the invention in general terms. Like numerals refer to like parts throughout the disclosure.

DETAILED DESCRIPTION OF THE PREFERRED EMBODIMENTS

The embodiments according to the present invention will be described in more detail with reference to the accompanying drawings.

Figure 1:
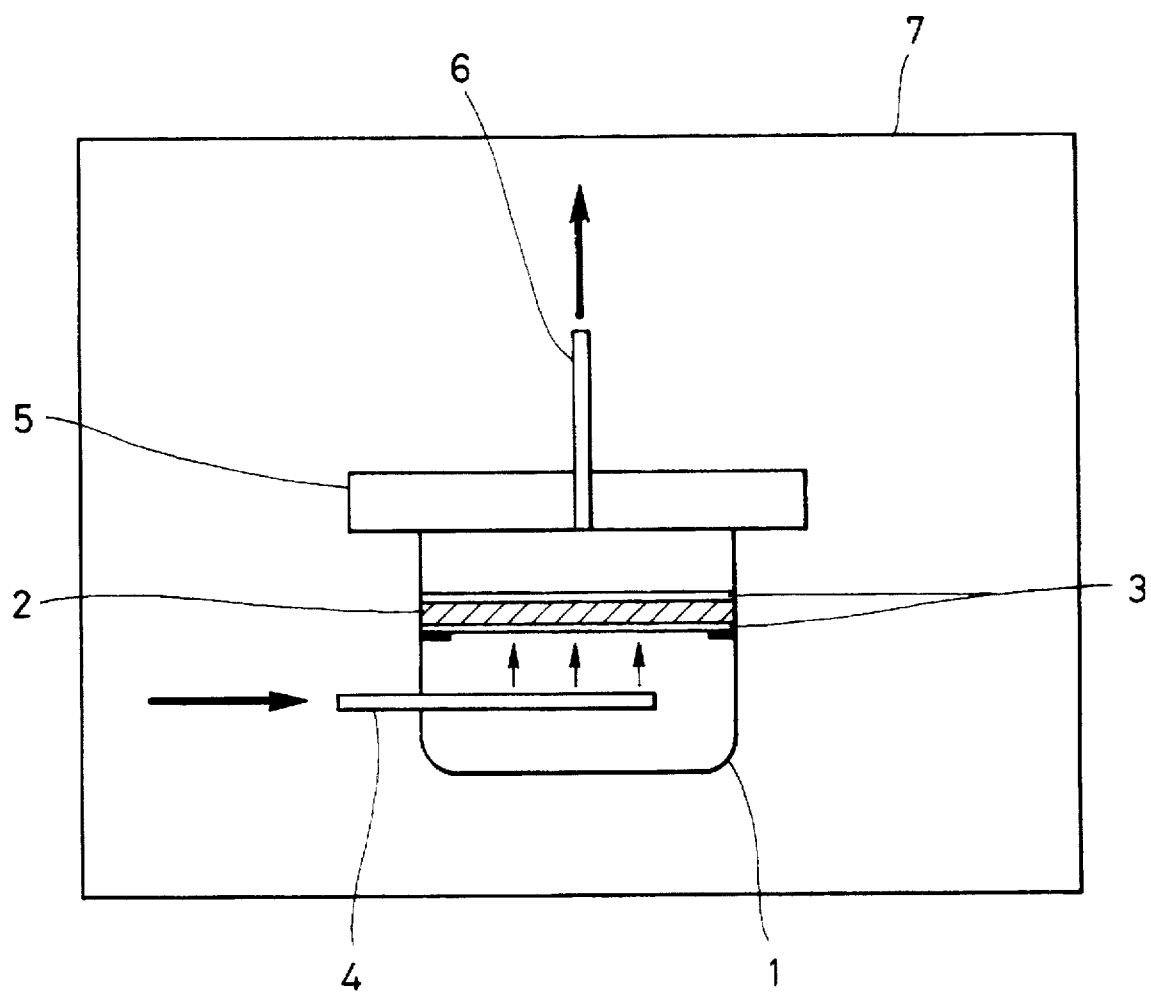
FIG. 1 is a schematic sectional view showing a device for feeding metalorganic gas from solid raw materials to a growth chamber in a conventional MOCVD apparatus.
Figure 2A:
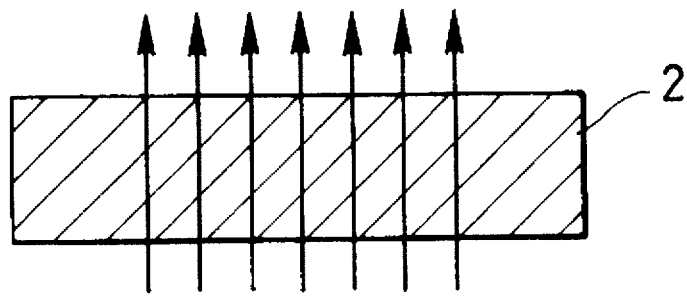
FIGS. 2A and 2B are schematic sectional views showing bulks of the solid raw material powder in an initial status and in a lapsing status respectively.
Figure 2B:
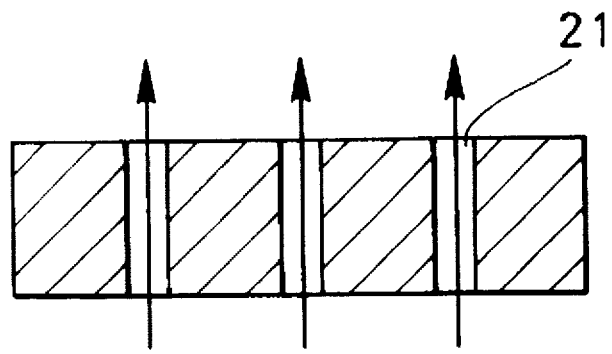
Figure 3:
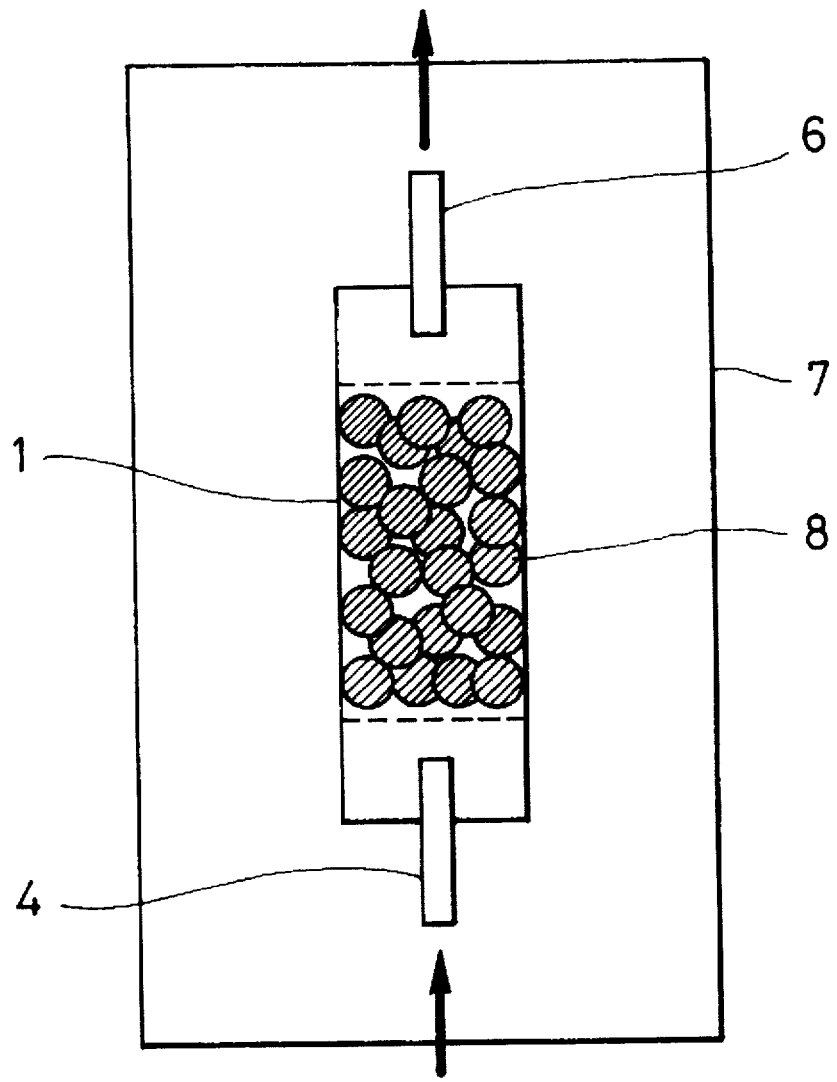
FIG. 3 is a schematic sectional view showing a device for feeding metalorganic gas from solid raw materials to a growth chamber in a MOCVD apparatus according to the invention.

FIG. 3 shows a device for feeding metalorganic gas from solid raw materials to a growth chamber in a MOCVD apparatus of one embodiment according to the present invention. In the figure, numeral 1 represents a container for absorptive porous grains, numeral 4 represents an inlet conduit for a carrier gas, numeral 6 represents an outlet conduit for a mixture gas including the carrier gas at a predetermined density and connected to the growth chamber, numeral 7 represents an oven for heating the container and numeral 8 represents porous grains for an absorption reagent into which a solid metalorganic material is absorbed.

As shown in FIG. 3, the porous grains 8, i.e., an absorption reagent is filled up between a pair of mesh-sieves and disposed in the container 1. Then the container 1 is heated in the oven 7 while the carrier gas is introduced through the inlet conduit 4 into the container under predetermined thermal conditions. The carrier gas passing through the porous grains 8 carries the metalorganic gas sublimated from the porous grains 8 as a mixture gas to go out through the outlet conduit 6, so that this device feeds the mixture gas to the growth chamber the MOCVD apparatus.

A process of absorbing a solid metalorganic material into an absorption reagent consisting of porous grains will be described. It should be noted that the following steps are preformed under an inert gas atmosphere, FIGS. 4A to 4D conceptually illustrate the absorbing process. In the figure, numeral 22 represents a solution in which a solid metalorganic material is dissolved and numeral 81 represents absorptive porous grains.

Figure 4A:
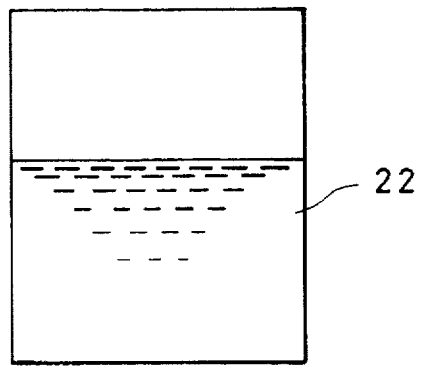
FIGS. 4A to 4D are schematic sectional views for illustrating a process of absorbing a solid metalorganic material into an absorption reagent consisting of porous grains, each showing a schematic sectional view of a container for a solid metalorganic material solution and/or an absorption reagent according to the invention.

As shown in FIG. 4A, first, a solid metalorganic material is dissolved in a solvent as a saturated solution. One or more of the DPM metal complexes capable of be used in the MOCVD are used for the solid metalorganic material. The organic solvent such as acetonitrile, acetone, tetrahydrofuran or the like is used for the solvent. It should be noted that the solvent is dehydrated sufficiently to prevent the reaction of the DPM metal complex with water.

Figure 4B:
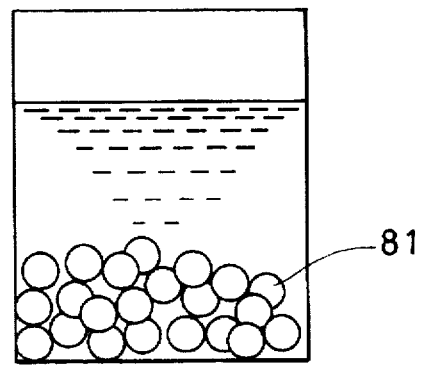

As shown in FIG. 4B, next, absorptive porous grains are added into the prepared solution. For the porous grains, an absorption reagent such as a synthesized zeolite, silica gel or the like is used. The porous grains are selected from a grain group with a grain diameter of 1 to 5 mm on the average in view of both facilitations of passing the carrier gas thereamong and of mixing the carrier gas and the sublimated metalorganic gas. Countless fine holes are formed on and in each porous grain to support much absorptive power. Its hole diameter depends on the molecular size of the DPM metal complex to be used. For example, since one-ligand DPM metal complexes such as Li(DPM), K(DPM) and the like have a size of 10 to 20 angstroms per one molecule, each hole diameter of each porous grain are preferably layout and formed to be a good match for such a molecular size. In case of two- or three-ligand DPM metal complexes, each hole diameter of each porous grain are also layout and formed to be a good match for its molecular size.

In case that the synthesized zeolite is preferably used for the absorptive porous grain in the invention, it can be formed to provide the best matching fine holes to the molecular size of metalorganic material. The diameters of such holes can be decided in the size to be the smallest in the hole layout, so that absorption of molecules is achieved as far as the holes have the smallest size or more. In other words, the absorption reagent consisting of porous grains into which a solid metalorganic material is absorbed has a plurality of fine holes each having the smallest size or more of the molecule of metalorganic material in the embodiment.

In another embodiment, absorptive porous grains of synthesized zeolite are prepared to have a plurality of fine holes each having the substantially smallest size of the molecule of metalorganic material. In this case, since the molecular sieve effect occurs during the absorption, the purity of metalorganic material is improved preferably.

After the absorption reagent of porous grains prepared mentioned above is sufficiently dried and it is added into the solution as shown in FIG. 4A.

Figure 4C:
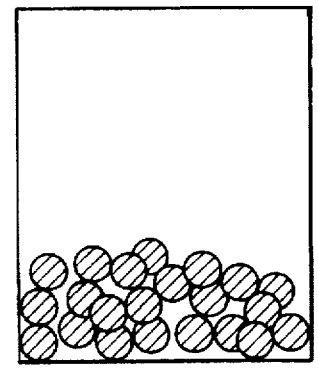
Figure 4D:
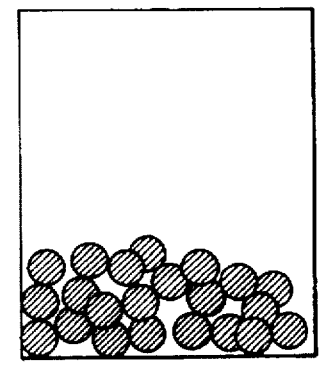

As shown in FIG. 4C, the metalorganic material solution is removed from the container and, finally, the absorption reagent consisting of porous grains containing the metalorganic material together with the solvent is dried to remove such a solvent as shown in FIG. 4D. In this way, the absorption reagent consisting of porous grains into which a solid metalorganic material is absorbed.

As seen from the forgoing description, the method or device for feeding metalorganic gas from solid raw materials in the MOCVD according to the present invention is characterized in that there is used the absorptive porous grains into which the solid metalorganic material is previously absorbed and is performed the smooth passing of the carrier gas among the absorptive porous grains in a high thermal atmosphere. Therefore each absorptive porous grain is constant in its size to maintain the passage for the carrier gas even when much materials are used, the mixture gas including the metalorganic gas at a predetermined constant density is obtained in stability for a long time under constant conditions It should thus be apparent that the scope of the teaching of this invention is not intended to be limited by only the embodiments that have been expressly disclosed and illustrated, but that instead the scope of the teaching of this invention should be read as being commensurate with the scope of the claims that follow.

What is claimed is:

1. A method for feeding a metalorganic gas from a solid metalorganic material in a MOCVD apparatus comprising the steps of:

dissolving the solid metalorganic material in an organic solvent to form a solution;

adding an absorption reagent into the solution;

absorbing the solid metalorganic material into the absorption reagent consisting of porous grains;

disposing the absorption reagent in a high thermal atmosphere to sublimate the solid metalorganic material; and passing a carrier gas through the absorption reagent, thereby stably obtaining a mixture gas comprising the carrier gas and the sublimated metalorganic gas at a saturated vapor pressure.

2. A device for feeding a metalorganic gas from a solid metalorganic material in a MOCVD apparatus comprising:

an absorption reagent consisting of porous grains in a solution in which a solid metalorganic material is dissolved;

a container including a plurality of mesh-sieves for accommodating and supporting the absorption reagent, the absorption reagent being disposed between the plurality of mesh-sieves;

means for heating the container; and means for feeding a carrier gas into the container to pass the carrier gas through the absorption reagent.

3. The device as set forth in claim 2, wherein each of the porous grains has an average grain diameter of 1 to 5 mm.

4. A method for providing a metalorganic gas, comprising the steps of:

dissolving a solid metalorganic material in a solvent to form a solution;

adding absorptive porous grains into the solution;

absorbing the solid metalorganic material into the absorptive porous grains; and sublimating the solid metalorganic material from the absorptive porous grains.

5. The method as set forth in claim 4, wherein the absorptive porous grains include zeolite or silica gel.

6. The method as set forth in claim 4, wherein the absorptive porous grain have an average grain diameter of 1 to 5 mm.

7. The method as set forth in claim 4, wherein the absorptive porous grain have a plurality of holes formed on and in each porous grain.

8. The method as set forth in claim 4, further comprising the step of passing a carrier gas through the sublimated metalorganic material.

9. The method as set forth in claim 4, wherein the step of sublimating the solid metalorganic material includes the step of placing the absorptive porous grains having the solid metalorganic material absorbed therein in a high temperature atmosphere.

10. The method as set forth in claim 5, wherein the solvent includes one of acetonitrile, acetone or tetrahydrofuran.

11. The method as set forth in claim 4, wherein the metalorganic material includes a DPM metal complex.

12. The method as set forth in claim 11, wherein the DPM metal complex includes Li(DPM) or K(DPM).

13. The method as set forth in claim 7, wherein a size of each of the plurality of holes is at least equal to a size of a molecule of the metalorganic material.

* * * * *

UNITED STATES PATENT AND TRADEMARK OFFICE
CERTIFICATE OF CORRECTION

PATENT NO.  : 5,722,184
DATED       : March 3, 1998
INVENTOR(S) : Atsushi Onoe et al.

It is certified that error appears in the above-indentified patent and that said Letters Patent is hereby corrected as shown below:

Col. 6, line 17, change "grain" to --grains--.
Col. 6, line 20, change "grain" to --grains--.
Col. 6, line 30, change "claim 5" to --claim 4--.

Signed and Sealed this

Twenty-seventh Day of October, 1998

Attest:

BRUCE LEHMAN

Attesting Officer                Commissioner of Patents and Trademarks